(12) United States Patent
Muthukumar et al.

(10) Patent No.: US 7,589,424 B2
(45) Date of Patent: Sep. 15, 2009

(54) THIN SILICON BASED SUBSTRATE

(75) Inventors: Sriram Muthukumar, Chandler, AZ (US); Devendra Natekar, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/221,997

(22) Filed: Aug. 8, 2008

(65) Prior Publication Data

US 2008/0303159 A1 Dec. 11, 2008

Related U.S. Application Data

(62) Division of application No. 11/388,354, filed on Mar. 23, 2006, now Pat. No. 7,443,030, which is a division of application No. 10/963,489, filed on Oct. 11, 2004, now Pat. No. 7,049,208.

(51) Int. Cl.
*H01L 29/00* (2006.01)
(52) U.S. Cl. .................... 257/758; 257/700; 257/774; 257/E23.059; 257/E23.063
(58) Field of Classification Search ......... 257/758–760, 257/700, 750; 438/613–624
See application file for complete search history.

(56) References Cited

U.S. PATENT DOCUMENTS

| | | | |
|---|---|---|---|
| 3,842,189 A | 10/1974 | Southgate | |
| 4,642,889 A | 2/1987 | Grabbe | |
| 5,321,583 A | 6/1994 | McMahon | |
| 5,350,886 A | 9/1994 | Miyazaki et al. | |
| 5,477,933 A | 12/1995 | Nguyen | |
| 5,578,526 A | 11/1996 | Akram et al. | |
| 5,796,417 A | 8/1998 | Nobel | |
| 5,944,537 A | 8/1999 | Smith et al. | |
| 6,068,669 A | 5/2000 | Farnworth et al. | |
| 6,245,594 B1 | 6/2001 | Wu et al. | |
| 6,255,740 B1 | 7/2001 | Tsuji et al. | |
| 6,265,245 B1 | 7/2001 | Farnworth et al. | |
| 6,274,821 B1 | 8/2001 | Echigo et al. | |
| 6,372,620 B1 | 4/2002 | Oosawa et al. | |
| 6,451,627 B1 | 9/2002 | Coffman | |
| 6,469,908 B2 | 10/2002 | Patel et al. | |
| 6,524,115 B1 | 2/2003 | Gates et al. | |
| 6,528,349 B1 | 3/2003 | Patel et al. | |
| 6,528,874 B1 | 3/2003 | Lijima et al. | |
| 6,548,328 B1 | 4/2003 | Sakamoto et al. | |
| 6,582,983 B1 | 6/2003 | Runyon et al. | |
| 6,589,855 B2 | 7/2003 | Miyamoto et al. | |
| 6,589,870 B1 | 7/2003 | Katoh | |
| 6,590,291 B2 * | 7/2003 | Akagawa ................... 257/774 |

(Continued)

OTHER PUBLICATIONS

Mould et al., "A New Alternative for Temporary Wafer Mounting," (2002) GaAsMANTECH Conference, 4 pages.

(Continued)

*Primary Examiner*—Dung A. Le
(74) *Attorney, Agent, or Firm*—Blakely, Sokoloff, Taylor & Zafman LLP (57) ABSTRACT

Embodiments of the invention provide a device with a die and a substrate having a similar coefficient of thermal expansion to that of the die. The substrate may comprise a silicon base layer. Build up layers may be formed on the side of the base layer further from the die.

10 Claims, 7 Drawing Sheets

U.S. PATENT DOCUMENTS

| | | | |
|---|---|---|---|
| 6,617,236 | B2 | 9/2003 | Oosawa et al. |
| 6,646,337 | B2 | 11/2003 | Lijima et al. |
| 6,671,947 | B2 | 1/2004 | Bohr |
| 6,674,297 | B1 | 1/2004 | Florence, Jr. et al. |
| 6,753,614 | B2 | 6/2004 | Yamazaki et al. |
| 6,782,610 | B1 | 8/2004 | Lijima et al. |
| 6,828,221 | B2 | 12/2004 | Lijima et al. |
| 6,884,709 | B2 | 4/2005 | Lijima et al. |
| 6,908,792 | B2 | 6/2005 | Bruce et al. |
| 7,244,125 | B2 | 7/2007 | Brown et al. |
| 7,400,041 | B2 | 7/2008 | Muthukumar et al. |
| 2002/0171133 | A1 | 11/2002 | Mok et al. |
| 2003/0003779 | A1 | 1/2003 | Rathburn |
| 2003/0092220 | A1 | 5/2003 | Akram |
| 2003/0099097 | A1 | 5/2003 | Mok et al. |
| 2003/0103338 | A1 | 6/2003 | Vandentop et al. |
| 2003/0207492 | A1 | 11/2003 | Maeda et al. |
| 2004/0043533 | A1 | 3/2004 | Chua et al. |
| 2004/0089464 | A1 | 5/2004 | Yamada |
| 2004/0099960 | A1 | 5/2004 | Adae-Amoakoh et al. |
| 2004/0129451 | A1 | 7/2004 | Wachtler |
| 2004/0229445 | A1 | 11/2004 | Suzuki et al. |
| 2005/0003649 | A1 | 1/2005 | Takao |
| 2005/0003650 | A1 | 1/2005 | Ramanathan et al. |
| 2005/0026476 | A1 | 2/2005 | Mok et al. |
| 2005/0239275 | A1 | 10/2005 | Muthukumar et al. |
| 2005/0263869 | A1 | 12/2005 | Tanaka et al. |
| 2005/0282374 | A1 | 12/2005 | Hwang et al. |
| 2006/0038303 | A1 | 2/2006 | Sterrett et al. |
| 2006/0046433 | A1 | 3/2006 | Sterrett et al. |
| 2006/0077644 | A1 | 4/2006 | Nickerson et al. |
| 2006/0094340 | A1 | 5/2006 | Ouderkirk et al. |
| 2006/0112550 | A1 | 6/2006 | Kim et al. |
| 2007/0001277 | A1 | 1/2007 | Ichikawa |
| 2007/0007983 | A1 | 1/2007 | Salmon |

OTHER PUBLICATIONS

North Corporation, "Neo-Manhattan Technology: A Novel HDI Manufacturing Process," from IPC Flex & Chips Symposium, Feb. 2003, 32 pages.

Mallik, D. et al., "Advanced Package Technologies for High-Performance Systems," Intel Technology Journal, vol. 9, Issue 4, Nov. 9, 2005, pp. 259-272.

Dataweek, "Stacked-CSP Delivers Flexibility, Reliability and Space-Saving Capabilities,", Aug. 27, 2003, 5 pages, retrieved from the internet at: http://dataweek.co.za/news.aspx?pklNewsID=11744.

Intel Corporation, "Silicon: Packaging Solutions for a Mobile Marketplace," retrieved from the internet at: http://web.archive.org/web/20040101-20041231re /http://www.intel.com/research/silicon/mobilepackaging.html.

McCormick, A., "Pins & Vias: New Processes, Materials Extend Flexible Circuit Use," May 2003, 3 pages, retrieved from the internet at: http://techon.nikkeibp.co.jp/NEA/archive/200305/244639/.

CHIPSUPPLY.COM, "Chip Scale Packaging (CSP)," 5 pages, retrieved from the internet at: http://www.chipsupply.com/corporate/interconnect%20solutions/chip&20scale.htm.

IMEC, "Advanced Packaging Technologies to Bridge the Interconnect Technology Gap," pp. 1-8.

Intel Coproration, "The Chip Scale Package (CSP)", 2000 Packaging Databook, 2000, Ch 15, pp. 15-1 through 15-16.

IVF—The Swedish Institute of Production Engineering Research, "Chapter B: Flip-Chip Technology", 7 pages, retrieved from the internet at: http://extra.ivf.se.ngl/B-Flip-Chip/ChapterB1.htm.

Mahajan R. et al., "The Evolution of Microprocessor Packaging," Intel Technology Journal, Q3, 2000, pp. 1-10.

Mahajan, R. et al., "Emerging Directions for Packaging Technologies," Intel Technology Journal, vol. 6, Issue 2, May 2002, pp. 62-75.

N. Tanaka et al. "Mechanical Effects of Copper Through-Vias in a 3D Die-Stacked Module" Electronic Components and Technology Conference, IEEE 2002, pp. 473-479.

M. Tomisaka et al. "Electroplating Cu Fillings for Through-Vias for Three-Dimensional Chip Stacking" 2002 Electronic Components and Technology Conference, IEEE, pp. 1432-1438.

M. Umemoto et al. Superfine Flip-Chip Interconnection in 20um-Pitch Utilizing Reliable Microthin Underfill Technology for 3D Stacked LSI, 2002 Electronic Components and Technology Conference, IEEE, pp. 1454-1456.

N. Tanaka et al. "Guidelines for Structural and Material-System Design of a Highly Reliable 3D Die-Stacked Module with Copper Through-Vias" 2003 Electronic Components and Technology Conference, IEEE, pp. 597-602.

K. Tanida et al. "Ultra-High-Density 3D Chip Stacking Technology" 2003 Electronic Components and Technology Conference, IEEE, pp. 1084-1089.

M. Sunohara et al. "Development of Wafer Thinning and Double-Sided Bumping Technologies for the Three-Dimensional Stacked LSI" 2002 Electronic Components and Technology Conference, IEEE, pp. 238-245.

M. Umemoto et al. "Non-Metallurgical Bonding Technology with Super-Narrow Gap for 3D Stacked LSI" 2002 Electronic Components and Technology Conference, IEEE, pp. 285-288.

* cited by examiner

THIN SILICON BASED SUBSTRATE

This is a Divisional Application of, and claims priority under 35 U.S.C. 120 from application Ser. No. 11/388,354, filed Mar. 23, 2006 now U.S. Pat. No. 7,443,030 which is a Divisional application Ser. No.: 10/963,489 filed Oct. 11, 2004, which is now U.S. Pat. No. 7,049,208.

BACKGROUND

Background of the Invention

To make a system with an integrated circuit device, such as a microprocessor or other related computer component, a microelectronic die is often bonded to a substrate, which is then coupled to another component such as a printed wired board. Electrical contacts on the die with a small pitch may be connected to corresponding contacts on the side of the substrate facing the die. On the other side of the substrate, there may be contacts with a larger pitch to allow easier connection to a printed wired board or other component. One or more levels of vias and traces separated by dielectric material may make the transition between the small pitch at the die side of the substrate to the larger pitch at the other side of the substrate. A die attached to a substrate is also easier to handle than a lone die.

For performance and other reasons, modern semiconductor dies often employ ultra low k (dielectric value) interlayer dielectric layers, which typically have low mechanical strength. Accordingly, the interlayer dielectric layers are sensitive to stress, such as stress created by mismatched coefficients of thermal expansion of the die and a substrate to which the die is attached.

DETAILED DESCRIPTION

In various embodiments, an apparatus and method relating to the formation of a substrate are described. In the following description, various embodiments will be described. However, one skilled in the relevant art will recognize that the various embodiments may be practiced without one or more of the specific details, or with other methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation.

Figure 1:
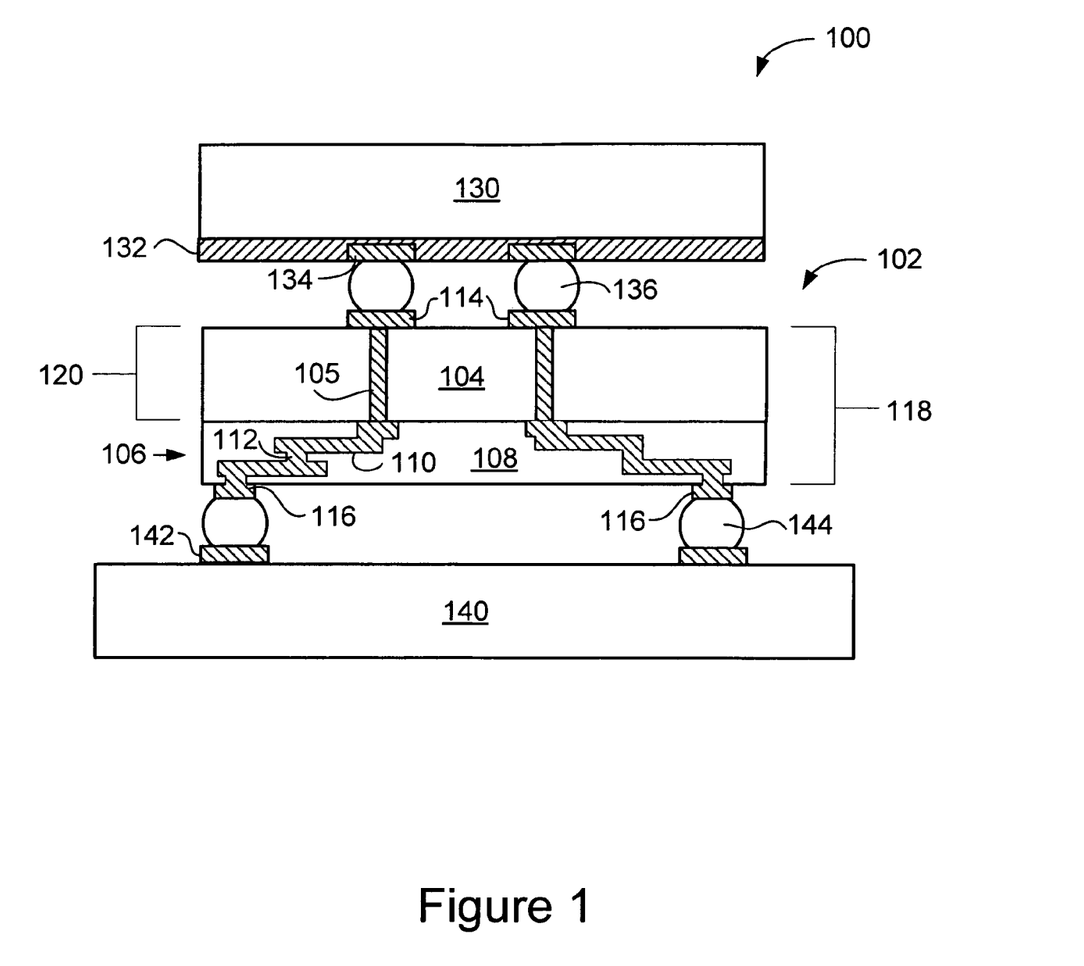
FIG. 1 is a side cross sectional view of a device that includes a microelectronic die and a substrate connected to the die.

FIG. 1 is a side cross sectional view of a device 100 that includes a microelectronic die 130, a substrate 102 connected to the die 130 and having a coefficient of thermal expansion ("CTE") similar to that of the die 130, and a printed circuit board 140 connected to the substrate 102, according to one embodiment of the invention. The die 130 may include one or more dielectric layers 132. Some or all of these dielectric layers 132 may be low k (dielectric value) materials, with, for example a k value below about 3. Such low k dielectric value materials may have low mechanical strengths that may not stand up to stresses generated by a mismatch in CTE between the die and substrate 102 during temperature changes. In embodiments where all or part of the substrate 102 has a similar CTE to that of the die 130, such stresses may be reduced.

The die 130 may include electrical contacts 134 by which electrical signals may pass to and from devices, such as transistors, of the die 130. The electrical contacts 134 of the die 130 may have a first pitch, or distance between the many electrical contacts 134. The electrical contacts 134 of the die 130 may be connected, electrically and/or mechanically, to electrical contacts 114 of the substrate 102. The contacts 114 of the substrate 102 may have a pitch substantially the same as the pitch of the contacts 134 of the die 130, so the contacts 134, 114 may match up for simple connection.

As illustrated in FIG. 1, the electrical contacts 134 of the die may be connected to the electrical contacts 114 of the substrate by connectors 136 such as solder balls. Other types of connectors may be used in alternate embodiments. For example, the connectors 136 may be copper bumps rather than solder, there may be a direct metal-to-metal bond between the contacts 134, 114, or other methods or structures may be used to connect the contacts 134, 114.

The substrate 102 may include a base or core layer 104 on which the other layers and structures may be fabricated. In some embodiments, the base layer 104 may comprise silicon. For example, in an embodiment where the die 130 is made largely of silicon, having a substrate 102 with a base layer 104 of silicon may result in the CTE of both the die 130 and substrate 102 being similar, so that stresses generated during heating and cooling of the device 100 may be significantly reduced. In other embodiments, the base layer 104 may comprise other materials, which may be selected to correspond closely to the CTE of the die 130.

There may be one or more build up layers 106, which may be on a side or surface of the base layer 104 furthest from the die 130. In an embodiment, the build up layers 106 may include one or more layers of dielectric material 108. The build up layers 106 may also include one or more trace layers with traces 110 separated by the dielectric material 108.

There may be vias 112 that extend through the layers of dielectric material 108 to electrically connect the different layers of traces 110 to each other.

There may be electrical contacts 116 at a side of the substrate 102 furthest from the die 130. The electrical contacts 116 at the side of the substrate 102 furthest from the die 130 may be electrically connected to the electrical contacts 114 on the side of the substrate 102 closest to the die 130 by the traces 110 and vias 112 of the build up layers 106 as well as vias 105 extending through the base layer 104. The vias 105 through the base layer 104 may have a pitch approximately equal to the pitch of the contacts 114.

The thickness 120 of the base layer 104 may be less than 200 microns in one embodiment. In another embodiment, the thickness 120 may be less than about 150 microns. In yet another embodiment, the thickness 120 may be between about 100 and 150 microns. In yet other embodiments, the thickness 120 may be a different value. The vias 105 through the base layer 104 may have various aspect ratios in various embodiments, including between about 3:1 and 7:1 (height to width), less than 3:1, or greater than 7:1.

The total thickness 118 of the substrate may be between about 0.2 mm and about 0.3 mm in one embodiment. In other embodiments, the thickness 118 may be less or greater. The thickness of the build up layers 106 (the total thickness 118 minus the thickness 120 of the base layer 104) may be between about 180 microns and about 100 microns in one embodiment. The thickness of the build up layers 106 may be between about 100 microns and about 80 microns in one embodiment. Other embodiments may have greater or smaller thicknesses of the build up layers 106. This thickness may be made of multiple layers of dielectric material 108 and trace layers, each having a thickness of about 8-12 microns, although in other embodiments the thickness of each layer of the build up layers 106 may be greater or less.

In an embodiment, the pitch of the contacts 134, 114 and vias 105 may be less than about 200 microns. In another embodiment, the pitch may be between about 120 to about 180 microns, or between about 100 microns to about 130 microns, while other embodiments may have different pitches. In some embodiments, the pitch of the contacts 134, 114 and vias 105 may be related to the thickness of the base layer 104. In an embodiment, with a vias 105 having a diameter of about 12 microns, the pitch of the contacts 134, 114 and vias 105 may be 65 microns or greater.

A printed circuit board 140, such as a printed wired board or other printed circuit board type, may have electrical contacts 142. The contacts 142 of the printed circuit board 140 may have a pitch greater than the pitch of the contacts 134, 114 and vias 105. The electrical contacts 142 of the printed circuit board may be electrically and/or mechanically connected to the contacts 116 of the substrate 102. The pitch of the contacts 116 of the substrate may also be greater than the pitch of the contacts 134, 114 and vias 105, and may be approximately equal to the pitch of the contacts 142 of the circuit board 140. The electrical contacts 116 of the substrate 102 may be connected to the electrical contacts 142 of the circuit board 140 by connectors 144 such as solder balls. Other types of connectors 144 may be used in alternate embodiments. For example, the connectors 144 may be copper bumps rather than solder, there may be a direct metal-to-metal bond between the contacts 116, 142, pins such as in a pin grid array may be used as connectors 144, or other methods or structures may be used to connect the contacts 116, 142. Thus, the printed circuit board 140 may be electrically connected to the die 130 by the contacts 116, 142, traces and vias 110, 112, vias 105, and contacts 114, 134.

In some embodiments, the substrate 102 may also include active or passive devices (not shown), such as transistors, resistors, or other devices. For example, in embodiments where the base layer 104 may comprise silicon, the devices may be fabricated on the base layer 104 using known silicon fabrication processes prior to formation of the build up layers 106. Alternatively, discrete active or passive devices (not shown) may be mounted on the side of the base layer 104 without the build up layers 106 to provide such devices in close proximity to the die 130. Additional conductors may be formed in or on the base layer 104 to connect these devices to the die 130 via the contacts 114, 134 and conductors 136.

FIGS. 2a through 2i are cross sectional side views that illustrate how the substrate 102 of FIG. 1 may be fabricated according to one embodiment of the present invention.

Figure 2A:
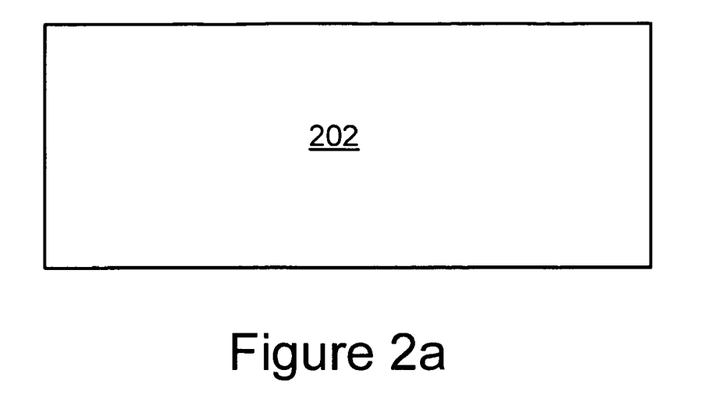
FIGS. 2a through 2i are cross sectional side views that illustrate how the substrate of FIG. 1 may be fabricated according to one embodiment of the present invention.
Figure 2B:
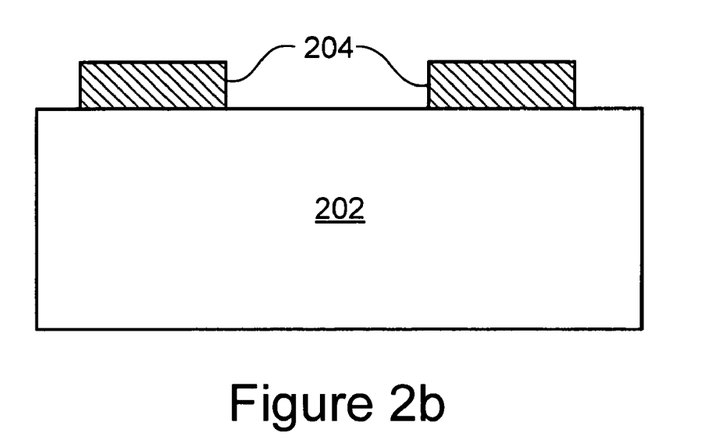

FIG. 2a illustrates a piece of base material 202. In some embodiments, the base material 202 may comprise a material with a similar CTE to that of the die 130 to which the substrate 102 will be attached. In one embodiment, the base material 202 may comprise silicon. FIG. 2b illustrates conductors 204 formed on the base material 202. The conductors 204 may be contact pads later to be connected to the vias 105, and may be formed by depositing and patterning a conductive material on the base material 202. In some embodiments, active or passive devices (not shown) may be fabricated on the base material 202. These active or passive devices may be fabricated prior or subsequent to forming the conductors 204 on the base material 202, and the vias 105, traces 110, and other electrical conductors may be connected to the active or passive devices.

Figure 2C:
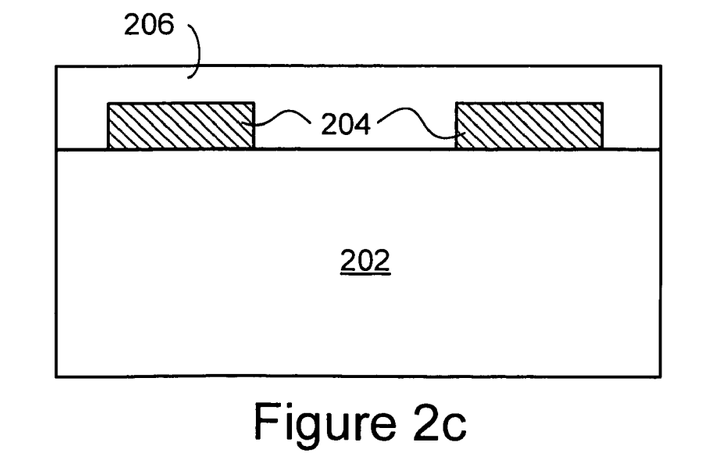

FIG. 2c illustrates a first dielectric layer 206 formed on the conductors 204. In various embodiments, various types of dielectric material may be used for the dielectric layer 206, with various processes used to apply the dielectric material.

Figure 2D:
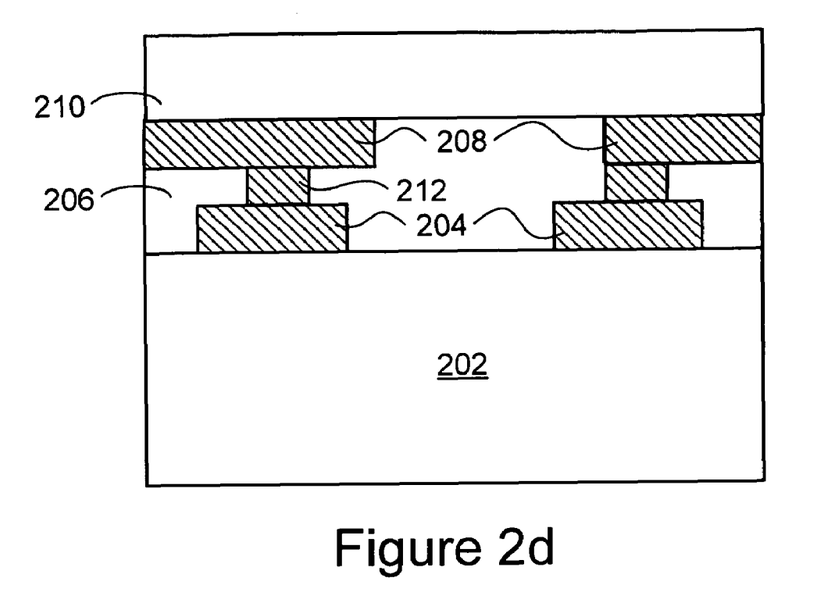

FIG. 2d illustrates traces 208 in a trace layer in the first dielectric layer 206, and conductive vias 212 formed through the first dielectric layer 206 to connect the traces 208 to the conductors 204. FIG. 2d also illustrates a second dielectric layer 210 formed on top of the traces 208 and first dielectric layer 206.

Figure 2E:
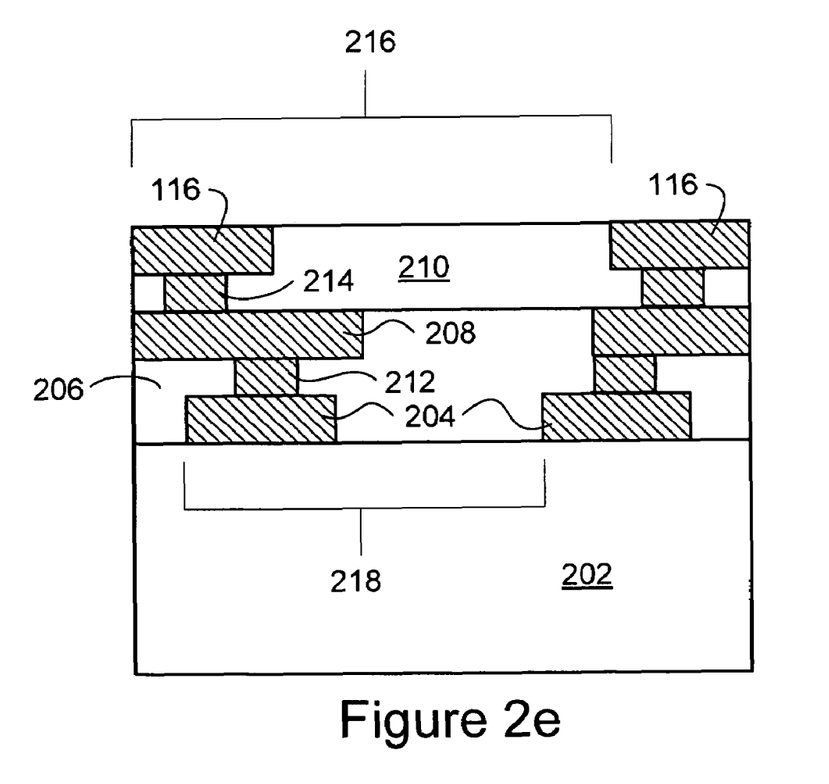

FIG. 2e illustrates the contacts 116 formed in the second dielectric layer 210, along with vias 214 connecting the contacts 116 to the traces 208 in the first dielectric layer 206. Note that while only two dielectric layers 206, 210 are shown in FIG. 2e, several more dielectric layers and layers of traces may be formed before forming the contacts 116. For example, in some embodiments there may be two to six layers of dielectric material and traces, although more layers may be used. In an embodiment, the trace layer may have a thickness of about 15 microns, and a dielectric layer may have a thickness from about 20 to about 30 microns, although other embodiments may include layers with different thicknesses. This may result in a total thickness of the build up layers 106 being as described with respect to FIG. 1, above. FIG. 2e illustrates that the pitch 216 of the contacts 116 may be greater than the pitch 218 of the contact pads 204, which may have about the same pitch as the contacts 114.

Figure 2F:
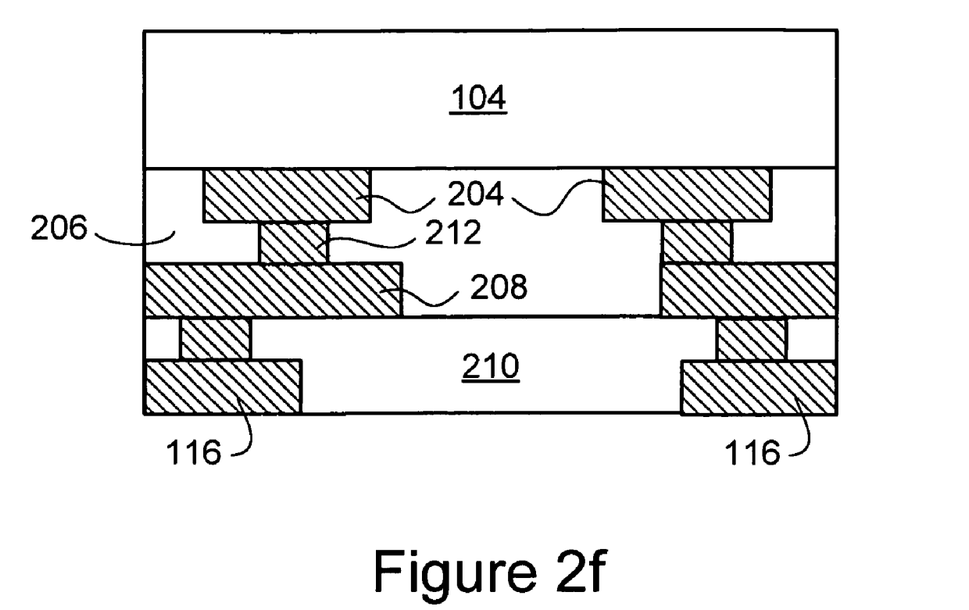

FIG. 2f illustrates the base layer 104, which may be formed by thinning the base material 202 in some embodiments. In an embodiment, after forming the build up layers 106 on the base material 202, a thinning operation, such as a back-grinding operation similar to that performed on the back side of a microelectronic die, is performed to reduce the thickness of the base material 202 and form the base layer 104.

Figure 2G:
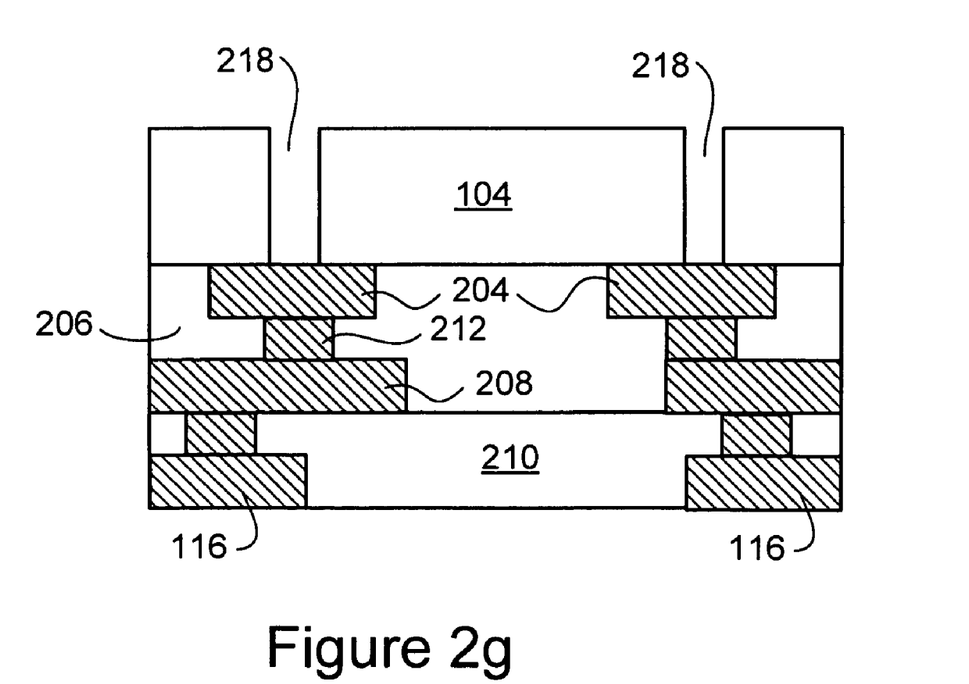

FIG. 2g illustrates the formation of via holes 218 in the base layer 104. The via holes 218 may extend from one surface of the base layer 104 to the conductors 204 that were formed on the other surface of the base layer 104. The via holes 218 may be formed by a wet etch process, a dry etch process, a mixed wet and dry etch process, or another process. The via holes 218 may have various aspect ratios in various embodiments, including between about 3:1 and 7:1 (height to width), less than 3:1, or greater than 7:1. The via holes 218 may have various shapes in different embodiments, including substantially vertically-walled via holes 218, via holes 218 with sloped walls, via holes with a flared section toward the top and substantially vertical walls further from the surface of the base layer 104. In some embodiments, the opening of the via holes 218 may have various widths, such as between 60 and 10 microns, or greater or smaller sizes. Various processes may be used to form the via holes 218, and may determine the aspect ratio and shape of the via holes. 218.

Figure 2H:
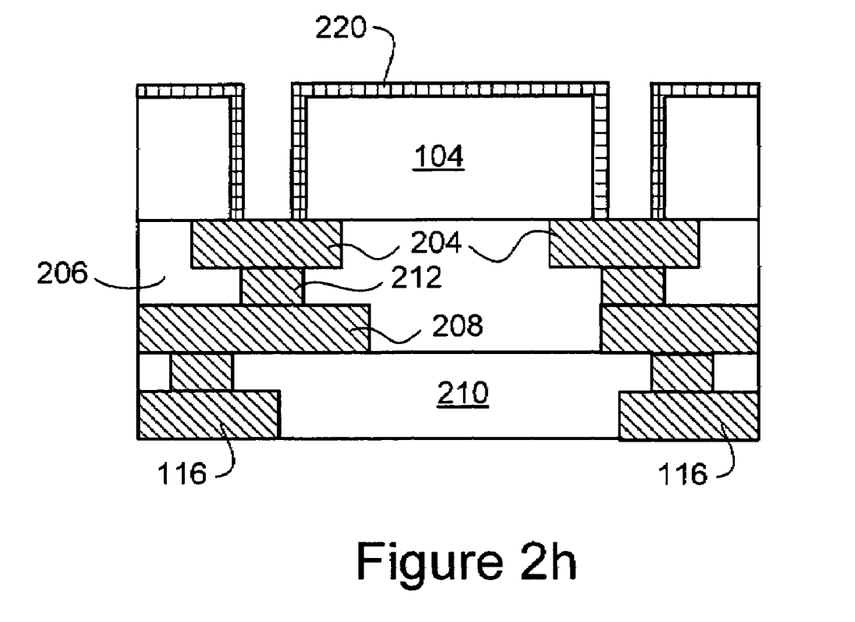

FIG. 2h illustrates a passivation layer 220 formed on the surface of the base layer 104 and via holes 218. The passivation layer 220 may comprise in some embodiments silicon oxide, silicon nitride, or another material. Additional layers, such as a seed layer, a barrier layer, or an adhesion layer may be formed as well as, or in addition to the passivation layer 220. For example, in an embodiment, a seed/barrier layer may be deposited using sputtering, and may comprise Ta, TaN, Cu, Ti, and/or TiN.

Figure 2I:
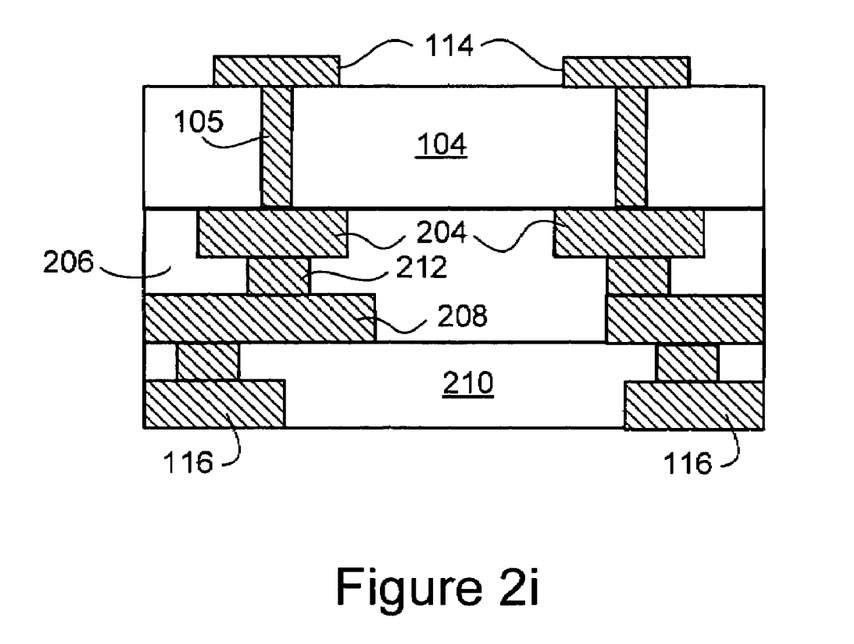

FIG. 2i illustrates the vias 105 that have been formed in the via holes 218 and the contacts that may be formed on the vias 105. The vias 105 may be formed by electroplating in one embodiment, although other processes may be used in other embodiments. The conductive contacts 114 may then be formed in electrical contact with the vias 105. At this point, there may be an electrical connection between the contacts 114 on one side of the substrate 102 with the contacts 116 on the other side of the substrate 102.

Figure 3:
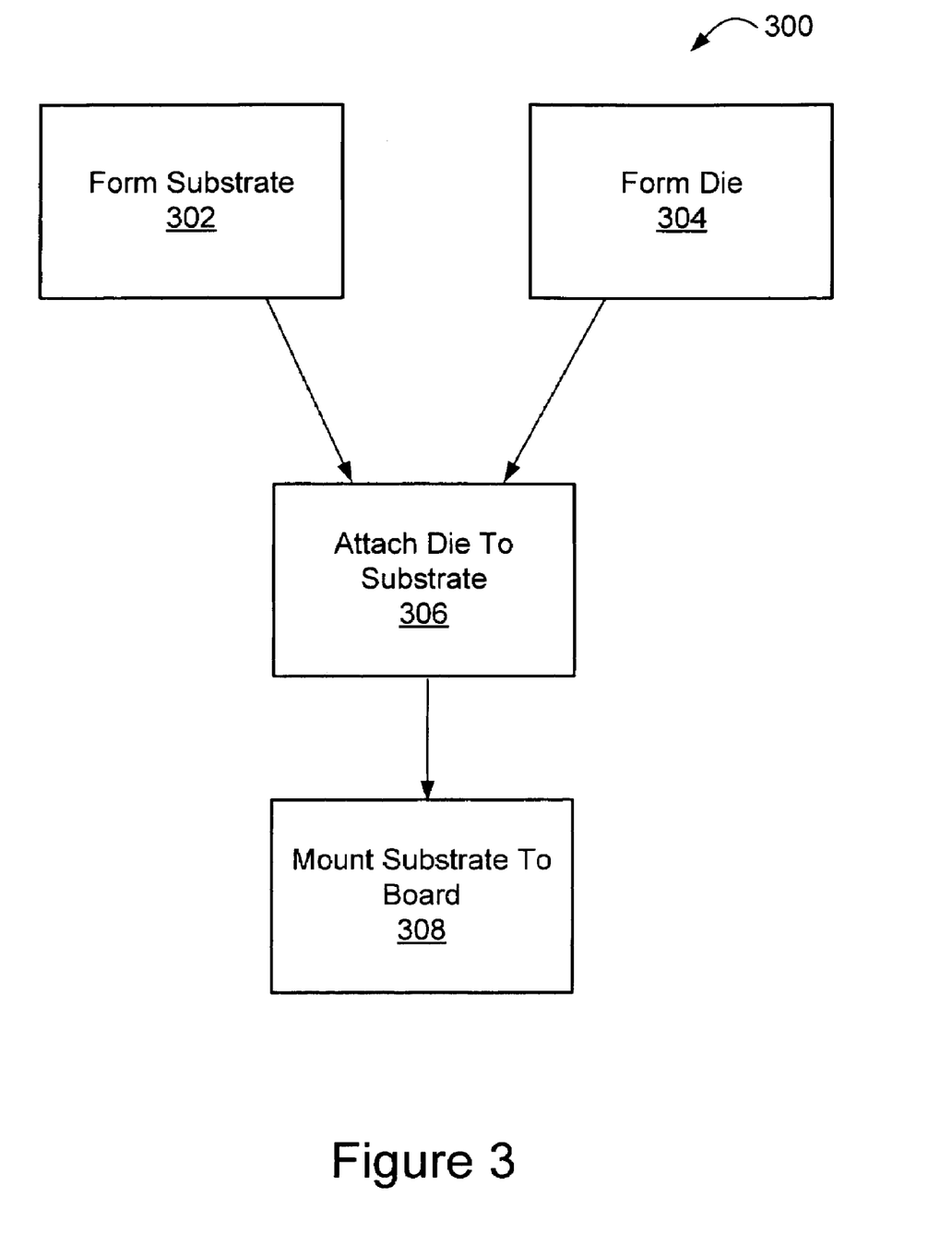
FIG. 3 is a flow chart that illustrates how the device of FIG. 1 may be made according to one embodiment of the present invention.

FIG. 3 is a flow chart 300 that illustrates how the device 100 may be made, according to one embodiment. The substrate 102 may be formed 302. This may be done as described above with respect to FIGS. 2a through 2i in one embodiment, although different ways to form 302 the substrate 102 may also be used. The die 130 may also be formed 304. Various known methods within the art may be used to form 304 the die 130.

The die 130 and substrate 102 may be attached 306 to form a die-substrate package. In an embodiment, the die 130 is a flip chip that is mounted to the substrate 102 and attached 306 using a bonding process such as solder bumps, thermo-compression bonding, eutectic bonding, anodic bonding, or another process.

The die-substrate package may then be mounted 308 to another component such as a printed circuit board. The printed circuit board may be, for example, a printed wired board. The package may be mounted 308 by a ball grid array (BGA) of solder bumps, by a pin grid array (PGA), or another method. In some embodiments, additional components may be connected to the printed circuit board to form a larger system.

Figure 4:
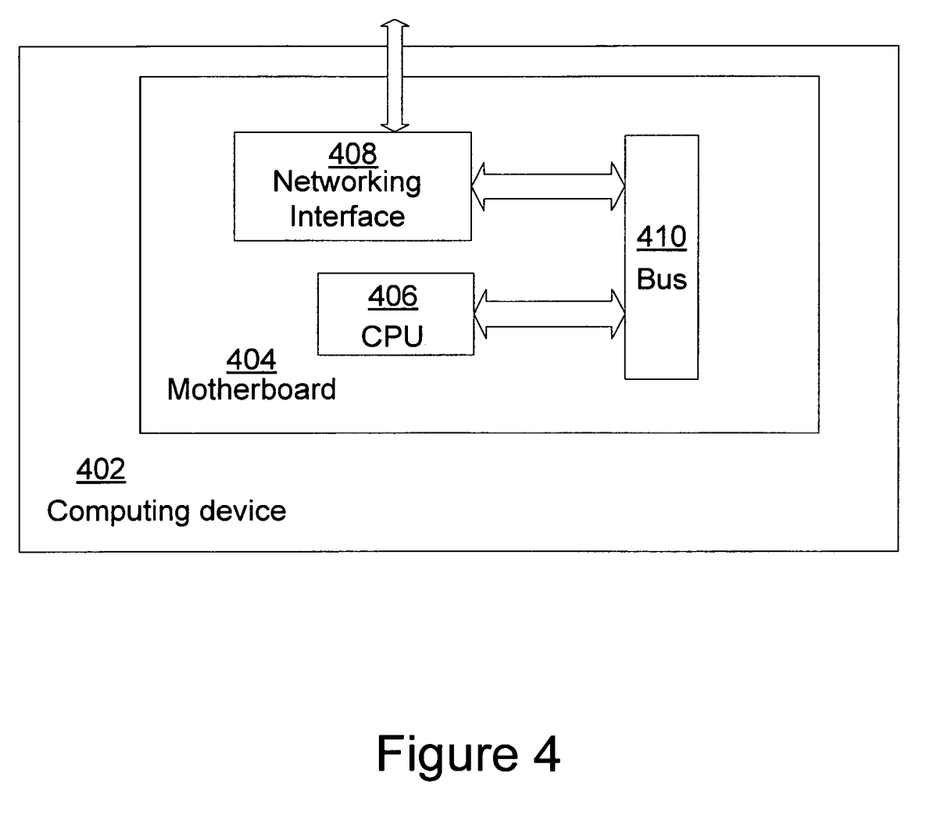
FIG. 4 illustrates a system in accordance with one embodiment.

FIG. 4 illustrates such a system 400 in accordance with one embodiment. As illustrated, for the embodiment, system 400 includes computing device 402 for processing data. Computing device 402 may include a motherboard 404. Motherboard 404 may be connected to in particular a processor 406, and a networking interface 408 coupled to a bus 410. More specifically, processor 406 may comprise the device 100. The processor 406 may include a processor die coupled to a substrate similar to that described earlier. The motherboard 404 may be an example of the printed circuit board 140 of FIG. 1, in some embodiments, with other components coupled thereto.

Depending on the applications, system 400 may include other components, including but are not limited to volatile and non-volatile memory, a graphics processor, a digital signal processor, a crypto processor, a chipset, mass storage (such as hard disk, compact disk (CD), digital versatile disk (DVD) and so forth), and so forth. These components may be communicably connected to the die so that electrical signals may pass therebetween.

In various embodiments, system 400 may be a personal digital assistant (PDA), a mobile phone, a tablet computing device, a laptop computing device, a desktop computing device, a set-top box, an entertainment control unit, a digital camera, a digital video recorder, a CD player, a DVD player, or other digital device of the like.

The foregoing description of the embodiments of the invention has been presented for the purposes of illustration and description. It is not intended to be exhaustive or to limit the invention to the precise forms disclosed. Various additional layers and/or structures may be included or omitted from the described embodiment. Processes described may performed in a different order than the described embodiment and steps may be left out/or added in additional embodiments. This description and the claims following include terms, such as left, right, top, bottom, over, under, upper, lower, first, second, etc. that are used for descriptive purposes only and are not to be construed as limiting. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

We claim:

1. A system, comprising:
   a microelectronic die having a first plurality of electrical contacts with a first pitch and having a first coefficient of thermal expansion;
   a substrate, having:
   a first major surface adjacent to the microelectronic die;
   a second major surface opposite the first major surface;
   a second plurality of electrical contacts with a second pitch about the equal to the first pitch on the first major surface electrically connected to the first plurality of electrical contacts of the microelectronic die;
   a base layer with a first side closer to the microelectronic die and a second side further from the microelectronic die;
   a plurality of build up layers on the second side of the base layer, the build up layers including metal traces separated by dielectric layers;
   a plurality of vias through the base layer to provide an electrical connection between the second plurality of electrical contacts and the metal traces; and
   a third plurality of electrical contacts at a boundary of the plurality of build up layers farthest from the base layer, the third plurality of contacts being electrically connected to the plurality of vias by the metal traces and having a third pitch greater than the first and second pitches; and
   a printed circuit board electrically connected to the third plurality of electrical contacts.

2. The system of claim 1, wherein the base layer comprises silicon.

3. The system of claim 1, wherein the second pitch is in a range from about 65 microns to about 200 microns.

4. The system of claim 1, wherein the second pitch is in a range from about 120 microns to about 180 microns.

5. The system of claim 1, wherein the base layer has a thickness less than about 150 microns.

6. The system of claim 1, wherein the vias have a diameter of about 12 microns, and the second pitch is in a range from about 65 microns to about 200 microns.

7. The system of claim 1, wherein the plurality of build up layers comprise more than five dielectric layers.

8. The system of claim 1, wherein each of the plurality of build up layers has a thickness less than about thirty microns.

9. The system of claim 1, wherein the printed circuit board comprises a printed wired board.

10. The system of claim 1, further comprising:
    a graphics processor communicably connected to the die; and
    mass storage communicably connected to the die.

* * * * *